United States Patent
He (10) Patent No.: US 8,971,125 B2
(45) Date of Patent: Mar. 3, 2015

(54) ERASE OPERATIONS WITH ERASE-VERIFY VOLTAGES BASED ON WHERE IN THE ERASE OPERATIONS AN ERASE CYCLE OCCURS

(75) Inventor: Deping He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/539,990

(22) Filed: Jul. 2, 2012

(65) Prior Publication Data

US 2014/0003156 A1    Jan. 2, 2014

(51) Int. Cl.
*G11C 11/34* (2006.01)

(52) U.S. Cl.
USPC ..................................... 365/185.22

(58) Field of Classification Search
USPC .................... 365/185.22; 13/185.22
See application file for complete search history.

(56) References Cited

U.S. PATENT DOCUMENTS

| | | | |
|---|---|---|---|
| 6,426,898 B1 | 7/2002 | Mihnea et al. | |
| 7,468,926 B2 * | 12/2008 | Shappir et al. | 365/218 |
| 7,668,017 B2 * | 2/2010 | Lusky et al. | 365/185.29 |
| 7,995,392 B2 | 8/2011 | Shibata | |
| 8,036,044 B2 * | 10/2011 | Dong et al. | 365/185.29 |
| 8,125,836 B2 | 2/2012 | Yip | |
| 8,130,551 B2 * | 3/2012 | Oowada et al. | 365/185.19 |
| 8,315,093 B2 * | 11/2012 | Dong et al. | 365/185.03 |
| 2010/0002523 A1 * | 1/2010 | Park et al. | 365/185.22 |
| 2010/0149881 A1 | 6/2010 | Lee et al. | |
| 2010/0284219 A1 * | 11/2010 | Kim et al. | 365/185.03 |
| 2011/0176362 A1 | 7/2011 | Shibata et al. | |
| 2012/0008412 A1 | 1/2012 | Park | |
| 2012/0026792 A1 * | 2/2012 | Moschiano et al. | 365/185.03 |
| 2012/0051138 A1 * | 3/2012 | Kim et al. | 365/185.17 |
| 2012/0206972 A1 * | 8/2012 | Shiino et al. | 365/185.19 |

* cited by examiner

*Primary Examiner* — Hoai V Ho
*Assistant Examiner* — Pablo Huerta
(74) *Attorney, Agent, or Firm* — Dicke, Billig & Czaja, PLLC (57) ABSTRACT

Memory devices and methods of erasing the memory devices are disclosed. One such method includes performing an erase cycle of an erase operation on a plurality of memory cells, where performing the erase cycle of the erase operation includes selecting an erase verify voltage to be applied during the erase cycle from a plurality of erase verify voltages based on where in the erase operation the erase cycle occurs.

28 Claims, 5 Drawing Sheets

ERASE OPERATIONS WITH ERASE-VERIFY VOLTAGES BASED ON WHERE IN THE ERASE OPERATIONS AN ERASE CYCLE OCCURS

FIELD

The present disclosure relates generally to erasing memory cells and in particular the present disclosure relates to erase operations with erase-verify voltages based on where in the erase operations an erase cycle occurs.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, such as a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select line is connected to a source line, while each drain select line is connected to a data line, such as column bit line.

Memory cells are sometimes programmed using program/erase operations, e.g., where such an operation might involve first erasing a memory cell and then programming the memory cell. For example, a plurality of memory cells, such as a string of memory cells, a plurality of strings of memory cells, etc., might be erased at once, e.g., during an erase operation, and then one or more of the erased memory cells might be programmed, e.g., during a program operation. A plurality of memory cells erased at once is sometimes called an erase block, for example.

For a NAND array, for example, a plurality of memory cells might sometimes be erased by grounding the access lines coupled to the plurality of memory cells and applying an erase voltage to a semiconductor over which the memory cells are commonly formed, and thus to the channels of the memory cells, to remove the charge from the charge-storage structures. More specifically, the charge is removed through Fowler-Nordheim tunneling of electrons from the charge-storage structure to the channel, resulting in an erase threshold voltage, e.g., an erase Vt, that can be less than zero.

An erase voltage is then applied to the plurality of memory cells to confirm whether the memory cells have been erased below an erase threshold voltage level. For example, an erase verify voltage might be applied to the access lines coupled to the plurality memory cells that are being erased. An erase voltage followed by an erase verify voltage might be referred to as an erase-and-verify cycle or simply as an erase cycle, and an erase operation might include one or more erase cycles to erase the plurality of memory cells. If any of the plurality of memory cells fail erase verification, the erase cycles may be repeated until the plurality of memory cells is erased or a certain number of erase cycles have occurred and the erasure is deemed to have failed.

A problem with erasing some flash memory devices is that different access lines in a given erase block can have faster or slower erase characteristics due to issues that can include, but are not limited to, different access line resistance, the physical placement of an access line in the memory array, and the access line coupling to the memory cells and other adjacent elements and access lines of the memory array. Because of this, slower erasing memory cells could get under erased (e.g., possibly causing additional erase cycles) and faster erasing memory cells could get over erased and overstressed (e.g., decreasing the lifespan of the affected memory cells and the endurance of the erase block).

For the reasons stated above, and for other reasons stated below which will become apparent to those skilled in the art upon reading and understanding the present specification, there is a need in the art for alternatives to existing erase operations.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

Figure 1:
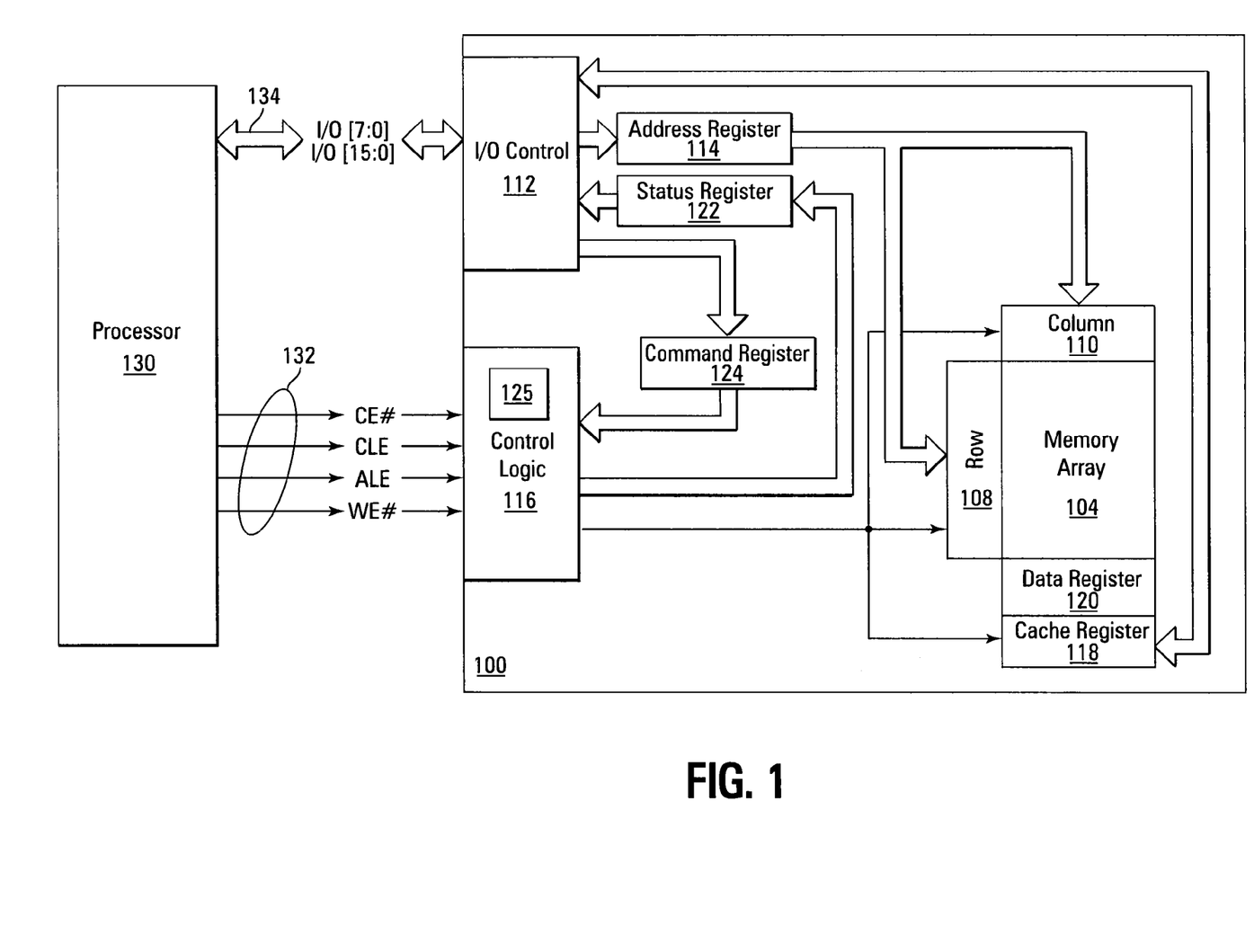
FIG. 1 is a simplified block diagram of a memory system, according to an embodiment.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

The erase verify voltages may be stored in trim circuitry 125, e.g., that may be included in control logic 116, as shown in FIG. 1. For example, trim circuitry 125 may include registers that can store the erase verify voltages. Control logic 116 may be configured to apply the erase verify voltages based on where in the erase operation the erase cycle occurs (e.g., based on which erase cycle is being performed). For example, trim circuitry 125 may store an erase-verify-voltage trim set, including a plurality (e.g. a set) of erase verify voltages, and control logic 116 may be configured to apply the erase verify voltages of the trim set to access lines, such as word lines, based on where in the erase operation the erase cycle occurs. For example, control logic 116 may be configured to select the erase verify voltage of the trim set based on where in the erase operation the erase cycle occurs.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
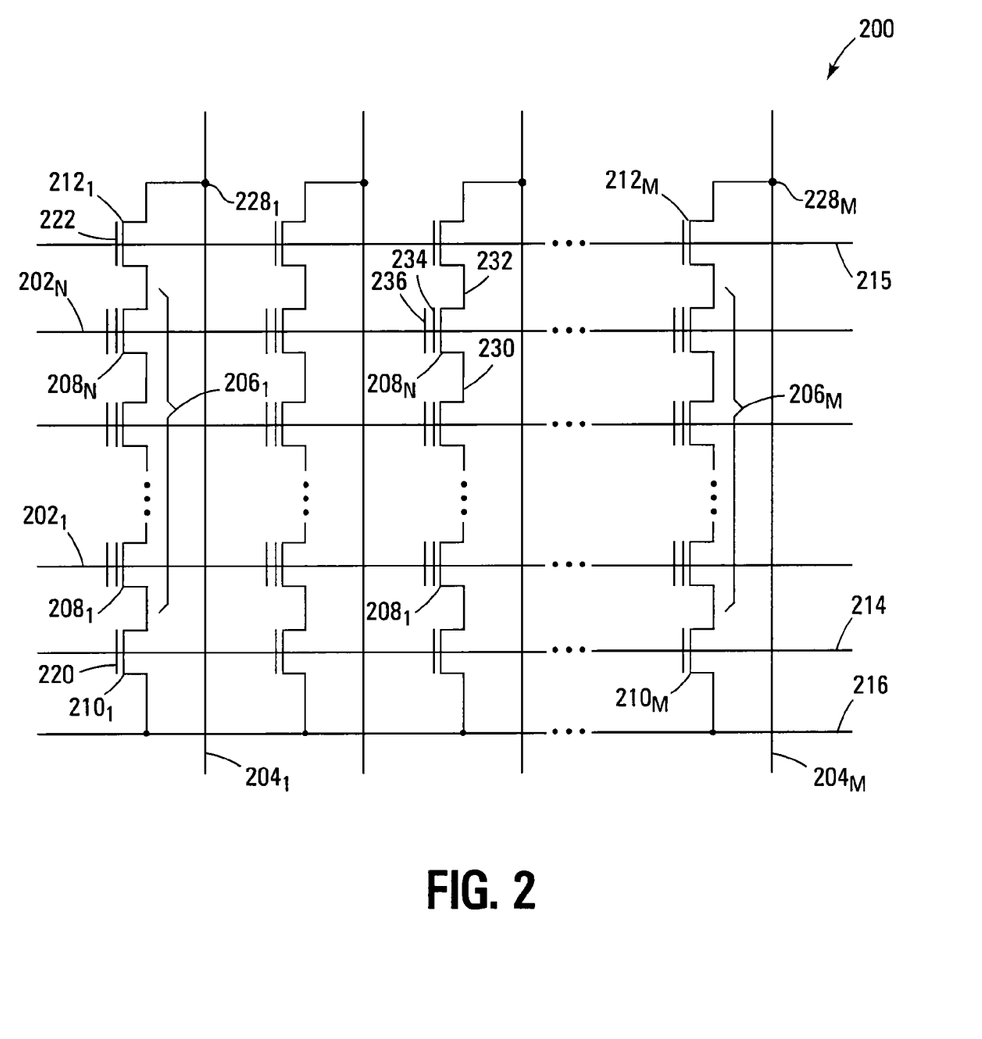
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting data lines, such as bit lines $204_1$ to $204_M$. The bit lines 204 may be coupled to global data lines, such as global bit lines (not shown), in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 is arranged in rows (each corresponding to a word line 202) and columns (each corresponding to a bit line 204). Each column may include a string of series-coupled memory cells, such as one of NAND strings $206_1$ to $206_M$. Each NAND string 206 is coupled to a common source line 216 and includes memory cells $208_1$ to $208_N$. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of a memory cell $208_1$ of the corresponding NAND string 206. For example, the drain of source select gate $210_1$ is connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of a memory cell $208_N$ of the corresponding NAND string 206. For example, the source of drain select gate $212_1$ is connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the memory cell, and a control gate 236, as shown in FIG. 2. Memory cells 208 have their control gates 236 coupled to (and in some cases form) a word line 202. A column of the memory cells 208 is a NAND string 206 coupled to a given bit line 204. A row of the memory cells 208 are those memory cells commonly coupled to a given word line 202.

Although the examples of FIGS. 1 and 2 are discussed in conjunction with NAND flash, the embodiments described herein are not limited to NAND flash, but can include other flash architectures, such as NOR flash, etc.

Figure 3:
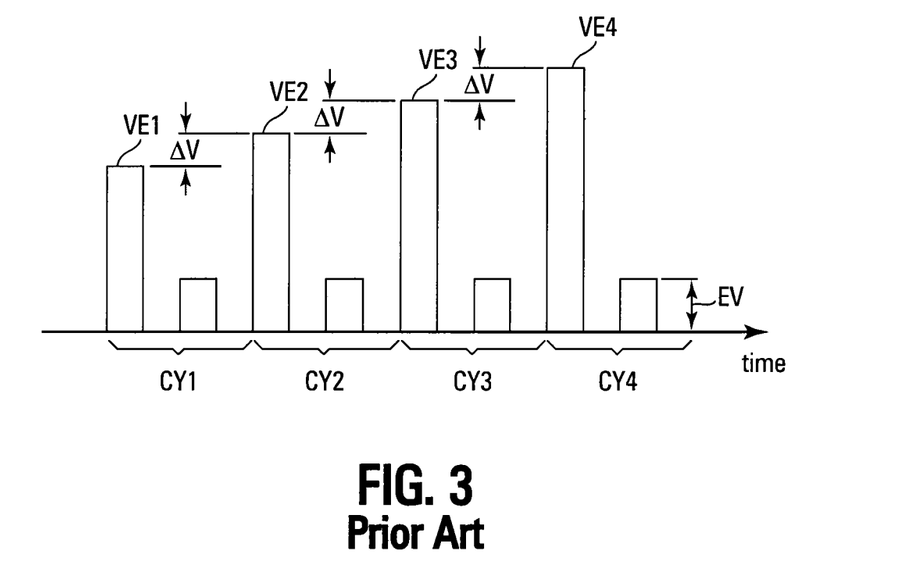
FIG. 3 illustrates an example of an erase operation of the prior art.

FIG. 3 illustrates an example of an erase operation of the prior art performed on one or more memory cells, such as a plurality of memory cells 208 in FIG. 2 concurrently. For example, the plurality of memory cells might include those memory cells formed over a common conductive region, such as a conductively doped portion of a semiconductor, e.g., a conductive well (e.g., a p-well or an n-well) formed in the semiconductor, etc. For example, the plurality of memory cells to be erased might include array 200 formed over a p-well or an n-well.

Alternatively, the plurality of memory cells to be erased might include a single string, such as a single NAND string 206. Note that in some architectures, each string might be over an individual conductive region in a semiconductor, such as an individual conductive well in the semiconductor, e.g., an individual p-well or n-well. For some embodiments, the erase operation might be performed on a plurality of memory cells prior to programming one or more memory cells of the plurality of memory cells, where the erase and subsequent programming might be referred to as a program/erase operation.

In the example, one or more erase cycles CY of the erase operation might be performed to erase the plurality of memory cells. For example, the erase cycles are performed in succession until a respective erase verify passes or until a certain number of erase cycles are performed without an erase verify passing.

Each erase cycle may include applying an erase voltage VE, e.g., an erase voltage pulse, for that cycle to the channels of the plurality of memory cells to be erased by applying the erase voltage VE to a common conductive region in a semiconductor over which the plurality of memory cells to be erased is formed, e.g., while the word lines, such as word lines $202_1$ to $202_N$, coupled to the plurality of memory cells are grounded. For example, when erasing a single NAND string 206, the erase voltage might be applied to a conductive well over which that single NAND string 206 is formed and by grounding word lines $202_1$ to $202_N$. When erasing a plurality of NAND strings 206, such as NAND strings $206_1$ to $206_M$, the erase voltage might be applied to a conductive well over which array 200 is formed and by grounding word lines $202_1$ to $202_N$. For example, the erase voltage may be said to be applied to the memory cells to be erased concurrently.

For some embodiments, a plurality of memory cells might be located adjacent to (e.g., on) substantially vertical semiconductor pillar. For example, substantially vertical strings (e.g., NAND strings) of series-coupled memory cells may be located adjacent to (e.g., on) substantially vertical semiconductor pillars. Memory arrays having such configurations, for example, may be referred to as three-dimensional memory (e.g., three-dimensional NAND) arrays.

A semiconductor pillar may act as channel region for the plurality of memory cells adjacent thereto. For example, during operation of one or more memory cells of a string, a channel can be formed in the corresponding semiconductor pillar. For some embodiments, the memory cells of a three-dimensional memory may be erased by an applying an erase voltage VE to the semiconductor pillars forming the channels of the plurality of memory cells. For example, a plurality of memory cells formed adjacent to a semiconductor pillar might be erased by applying an erase voltage VE to the semiconductor pillar that forms the channel region.

Each erase cycle may include an erase verify that may include applying an erase verify voltage EV for that cycle to word lines $202_1$ to $202_N$. The erase verify may include determining whether the memory cells are erased by sensing a current through the memory cells. For example, a string of memory cells might be deemed erased when a certain level of current passing through the bit line selectively coupled to the string is sensed. In other words, the memory cells in a string may be deemed erased when the erase verify voltage applied to the word lines coupled to the memory cells in the string causes the memory cells to turn on to an extent to allow the certain level of current to flow through the string. For example, the current flow through each of the bit lines $204_1$ to $204_M$ respectively selectively coupled to NAND strings $206_1$ to $206_M$ may be sensed when erasing NAND strings $206_1$ to $206_M$.

While the erase verify voltage EV is being applied, select gates 210 and 212 might be turned on, and either a voltage is applied to the bit line 204 that is greater than a voltage applied to source line 216 or a voltage is applied to source line 216 that is greater than a voltage applied to a bit line 204. For example, a positive voltage, such as Vcc (e.g., a supply voltage), might be applied to the bit line while the source line is grounded, or Vcc might be applied to the source line while the bit line is grounded.

In the example, erase voltage VE2 may be an erase voltage step $\Delta V$ greater than erase voltage VE1, erase voltage VE3 the erase voltage step $\Delta V$ greater than erase voltage VE2, and erase voltage VE4 the erase voltage step ΔV greater than voltage VE3. The same erase verify voltage EV is applied during each erase cycle.

The erase operation might start with applying erase voltage VE1 during erase cycle CY1 to the common conductive region over which the plurality of memory cells to be erased is formed. Erase voltage VE1 may be subsequently removed from the conductive region, and the erase verify of cycle CY1 may be performed by applying erase verify voltage EV to the word lines, e.g., word lines $202_1$ to $202_N$, coupled to the plurality of memory cells. While the erase verify voltage EV is being applied, the current flow through the bit line(s) selectively coupled to the memory cells being erased may be sensed to determine whether the erase verify passes, and the memory cells are erased, or the erase verify fails, and the memory cells are not sufficiently erased.

If the erase verify fails, erase cycle CY2 is subsequently performed. For example, the erase voltage VE1 may be increased by the erase voltage step ΔV, resulting in an erase voltage VE2=VE1+ΔV of erase cycle CY2 being applied to the common conductive region during erase cycle CY2. The erase voltage VE2 is subsequently removed, and the erase verify of cycle CY2 is performed by applying erase verify voltage EV to word lines $202_1$ to $202_N$. If the erase verify fails for erase cycle CY2, erase cycle CY3 is performed, and if the erase verify fails for erase cycle CY3, erase cycle CY4 is performed, etc.

Note that in the prior art example shown in FIG. 3 and discussed above in conjunction with FIG. 3, the same erase verify voltage EV, e.g., an erase voltage having a single magnitude, is used in each erase cycle. The magnitude of the erase voltage can determine whether the erase verify passes. For example, the higher the erase verify voltage, the more likely a plurality of memory cells is to pass the erase verify during a particular erase cycle, thus reducing the number of erase cycles. Instances where the erase verify voltage is higher, and the number of erase cycles required for the plurality of memory cells is reduced, might be referred to as "shallower" erasing.

In contrast, the lower the erase verify voltage, the less likely a plurality of memory cells is to pass the erase verify during a particular erase cycle, thus increasing the number of erase cycles. Instances where the erase verify voltage is lower and the number of erase cycles is increased, might be referred to as "deeper" erasing.

In some examples of the prior art, the single erase verify voltage might be selected based on an average expected erase behavior of a plurality of memory cells. However, for some examples of the prior art, when a plurality of memory cells is less worn from repeated program/erase cycles, "deeper" erasing, and thus a lower erase verify voltage, might be desirable, owing to unpredictability in the erase behavior of the newer memory cells. As the plurality of memory cells becomes more worn from the repeated program/erase cycles, e.g., around the middle of the life expectancy of the plurality of memory cells, the average expected erase behavior of a plurality of memory cells can become more predictable, and "shallower" erasing, and thus a higher erase verify voltage, might be desirable. As the plurality of memory cells approaches the end of its life, "deeper" erasing, and thus a lower erase verify voltage, might again be desirable. A single erase verify voltage might result in under erasing if the single erase verify voltage is too high or over erasing, e.g., leading to overstressing, of memory cells if the single erase verify voltage is too low.

For some examples of the prior art, voltage differences that may occur while programming target memory cells coupled to a selected word line can disturb the threshold voltages of untargeted memory cells coupled to the selected word line and partially program these memory cells. This may be referred to as program disturb. Successive program/erase operations may have a cumulative effect, in that each program operation can partially program the untargeted cells until the untargeted cells become programmed undesirably.

For some examples, a "deeper" erase, due to a lower erase verify voltage, can reduce the program disturb compared to a "shallower" erase, resulting from a higher erase verify voltage, when memory cells are less worn, and fewer program/erase operations have been applied. However, as the memory cells age and the program/erase operations increase, a "shallower" erase, resulting from a higher erase verify voltage, can reduce the program disturb compared to a "deeper" erase due to a lower erase verify voltage.

Figure 4:
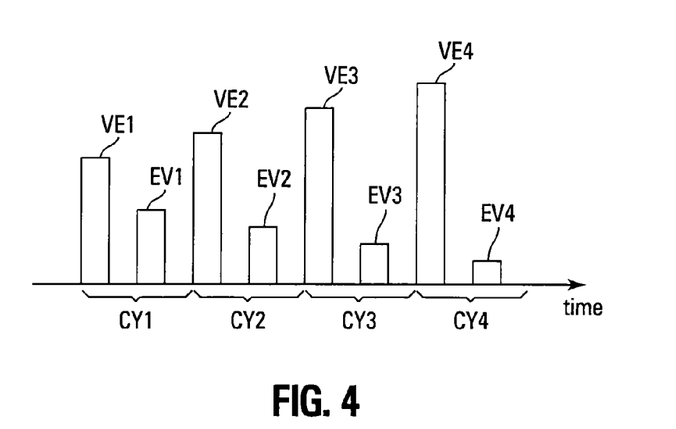
FIG. 4 illustrates an example of an erase operation, according to another embodiment.

FIG. 4 illustrates an example of an erase operation performed on one or more memory cells, such as a plurality of memory cells 208 in FIG. 2, e.g., a single NAND string 206 or a plurality of NAND strings 206 (e.g., NAND strings $206_1$ to $206_M$), concurrently. One or more erase cycles CY of the erase operation might be performed to erase the plurality of memory cells. For example, the erase cycles may be performed in succession until a respective erase verify passes or until a certain number of erase cycles are performed without an erase verify passing. As such, an erase operation may be defined as an operation having one or more erase cycles that are performed (e.g., executed) until an erase verify passes or until a certain number of erase cycles thereof are performed without an erase verify passing.

The discrete erase voltages (e.g., erase pulses) VE in FIG. 4 increase with increasing cycle number. For example, for each successive increase in erase cycle number, the erase voltage might increase by the erase voltage step ΔV. In other words, for example, erase voltage VE2 of erase cycle CY2 may be the erase voltage step ΔV greater than erase voltage VE1 of erase cycle CY1, erase voltage VE3 of erase cycle CY3 the erase voltage step ΔV greater than erase voltage VE2, and erase voltage VE4 of erase cycle CY4 the erase voltage step ΔV greater than erase voltage VE3.

In the example of FIG. 4, an erase verify voltage EV may be based on the number of the cycle in the erase operation during which that the erase verify voltage EV is applied. For example, for some embodiments, the erase verify voltage EV may be a function, e.g., a monotonic decreasing function, of the erase cycle number. In some embodiments, for example, the erase verify voltage EV2 applied during the erase cycle CY2 may be less than the erase verify voltage EV1 applied during erase cycle CY1; the erase verify voltage EV3 applied during the erase cycle CY3 may be less than the erase verify voltage EV2 applied during erase cycle CY2; and the erase verify voltage EV4 applied during erase cycle CY4 may be less than the erase verify voltage EV3 applied during erase cycle CY3, as shown in FIG. 4.

Since the cycle number matches the number of discrete erase voltages (e.g., erase pulses) that have been applied prior to applying a particular erase verify voltage, the particular erase verify voltage may be based on the number of discrete erase voltages that have been applied during the erase operation prior to applying the particular erase verify voltage. For example, erase verify voltage EV3 may be based on three discrete erase voltages having been applied during the erase operation. Alternatively, a particular erase verify voltage may be based on the number of the particular erase verify voltage in the erase operation. For example, erase verify voltage EV3 may be based on the fact that it is the third erase verify in the erase operation.

For some embodiments, the erase verify voltages EV may be stored in trim circuitry 125 (FIG. 1). For example, the set of erase verify voltages EV1 to EV4 may be stored in registers in trim circuitry 125. Control logic 116 may be configured to apply the erase verify voltages EV1 to EV4 respectively during erase cycles CY1 to CY4. For example, trim circuitry 125 may store an erase-verify-voltage trim set, including erase verify voltages EV1 to EV4, and control logic 116 may be configured to select an erase verify voltage of the trim set to be applied to word lines $202_1$ to $202_N$, for example, based on where in the erase operation the erase cycle occurs. For example, control logic 116 may be configured to select the erase verify voltage of the trim set to be applied to word lines $202_1$ to $202_N$ based on which erase cycle is being performed.

For some embodiments, control logic 116 may be configured to determine (e.g., keep track of) how many cycles of the erase operation have occurred and to select from a plurality of erase verify voltages the erase verify voltage to be applied based on what erase cycle of the erase operation is being performed. Similarly, control logic 116 may be configured to determine (e.g., keep track of) how many erase voltages have been applied or the number of the erase verify voltage currently being applied and to select from a plurality of erase verify voltages the erase verify voltage to be applied based on how many erase voltages have been applied or the number of the erase verify voltage currently being applied. For example, an erase verify voltage might be assigned to each erase cycle, based on where (e.g., when) in the erase operation the respective erase cycle occurs. In some embodiments, each of the plurality of erase verify voltages corresponds to a respective one of a plurality of erase cycles that can be performed during an erase operation.

During the erase operation, erase voltage VE1 is applied during erase cycle CY1 to a common conductive region in a semiconductor over which the plurality of memory cells to be erased is formed. Erase voltage VE1 is then removed, and erase verify voltage EV1 is applied to word lines $202_1$ to $202_N$ during the erase verify of cycle CY1. If the erase verify fails, erase voltage VE2 is applied during erase cycle CY2. Erase voltage VE2 is then removed, and erase verify voltage EV2 is applied to word lines $202_1$ to $202_N$ during the erase verify of cycle CY2. If the erase verify fails for erase cycle CY2, erase cycle CY3 is performed, and if the erase verify fails for erase cycle CY3, erase cycle CY4 is performed.

Figure 5:
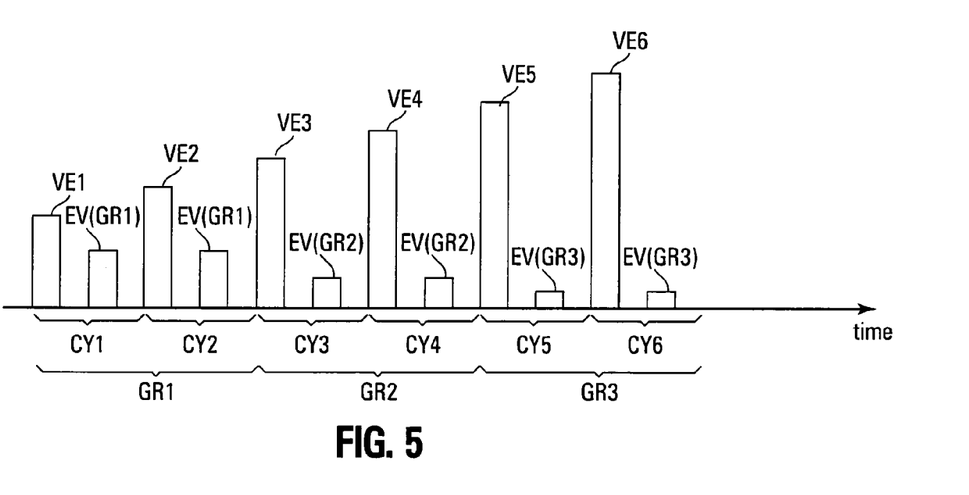
FIG. 5 illustrates an example of an erase operation, according to another embodiment.

FIG. 5 illustrates another example of an erase operation performed on one or more memory cells, such as a plurality of memory cells 208 in FIG. 2, e.g., a single NAND string 206 or a plurality of NAND strings 206 (e.g., NAND stings $206_1$ to $206_M$), concurrently. One or more erase cycles CY of the erase operation might be performed to erase the plurality of memory cells. For example, the erase cycles may be performed in succession until a respective erase verify passes or until a certain number of erase cycles are performed without an erase verify passing.

The discrete erase voltages (e.g., erase pulses) VE in FIG. 5 may increase with increasing cycle number. For example, for each successive increase in erase cycle number, the erase voltage might increase by the erase voltage step $\Delta V$ in a manner similar to that discussed above in conjunction with FIG. 4.

In the example of FIG. 5, the erase cycles of the erase operation may be divided into groups GR of erase cycles, where the erase cycles of each group may use a common erase verify voltage EV for that group, and the erase verify voltages may be a function of the group number. In the example of FIG. 5, the erase verify voltages might monotonically decrease with increasing group number. For example, the erase verify voltage EV(GR2) applied during the erase cycles CY3 and CY4 of group GR2 may be less than the erase verify voltage EV(GR1) applied during the erase cycles CY1 and CY2 of group GR1, and the erase verify voltage EV(GR3) applied during the erase cycles CY5 and CY6 of group GR3 may be less than the erase verify voltage EV(GR2) applied during the erase cycles CY3 and CY4 of group GR2. For other embodiments, erase verify voltage EV(GR2) might be greater than erase verify voltage EV(GR1), and erase voltage EV(GR3) might be less than or equal to erase verify voltage EV(GR1).

Erase verify voltages EV(GR1) to EV(GR3) may be stored in the registers of trim circuitry 125. For example, trim circuitry 125 may store an erase-verify-voltage trim set, including erase verify voltages EV(GR1) to EV(GR3), and control logic 116 may be configured to apply one of the erase verify voltages EV(GR1) to EV(GR3) of the trim set to word lines $202_1$ to $202_N$, for example, based on which group of erase cycles is being performed.

For some embodiments, control logic 116 may be configured to select a first erase verify voltage when the erase cycle is any one of a first plurality (e.g., a group) of erase cycles of the erase operation and to select a second erase verify voltage different than the first erase verify voltage when the erase cycle is any one of a second plurality of erase cycles of the erase operation. For example, control logic 116 may be configured to select erase voltage EV(GR1) from erase verify voltages EV(GR1) to EV(GR3) when the erase cycle is one of erase cycles of group GR1 and to select erase voltage EV(GR2) from erase verify voltages EV(GR1) to EV(GR3) when the erase cycle is one of erase cycles of group GR2.

For some embodiments, trim circuitry 125 may store as a first trim set, the trim set shown in FIG. 5 having erase verify voltages that decrease with an increasing group number and a second trim set having erase verify voltage EV(GR2) greater than erase verify voltage EV(GR1) and erase voltage EV(GR3) less than or equal to erase verify voltage EV(GR1). Control logic 116 may be configured to apply the first and second trim sets based on the number of program/erase operations that have been performed. For example, the second trim set might be applied when the memory device is less worn and fewer program/erase operations have been performed, and the first trim set might be applied when the memory device is more worn and more program/erase operations have been performed. The second trim set might be applied in response to the number of program/erase operations being less than or equal to a certain number, and the first trim set might be applied in response to the number of program/erase operations being greater than the certain number.

Figure 6:
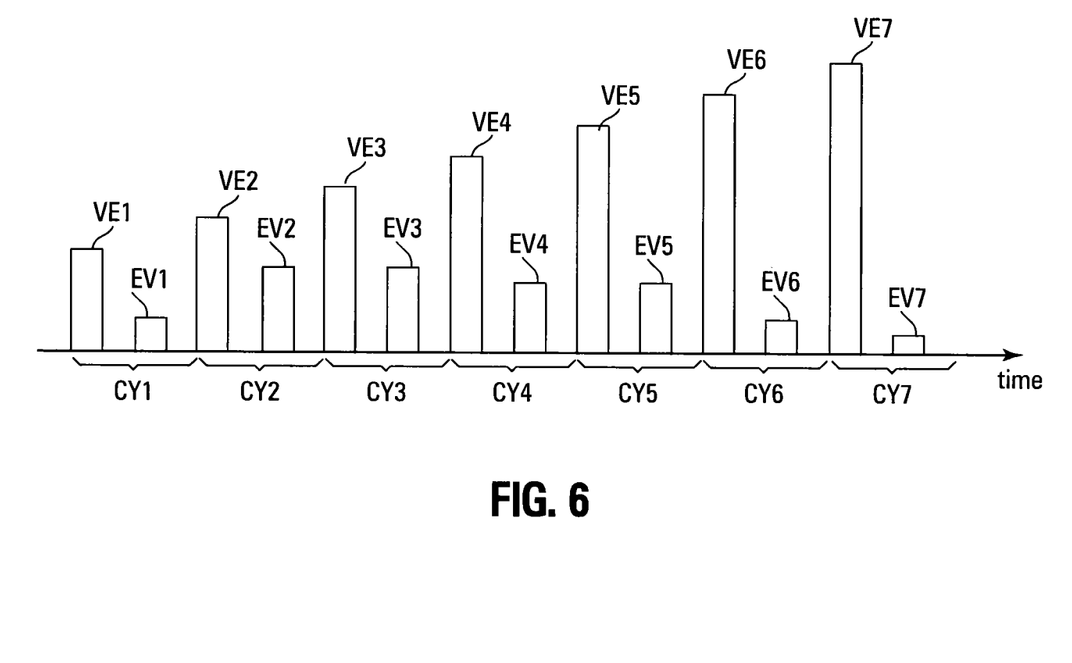
FIG. 6 illustrates an example of an erase operation, according to another embodiment.

FIG. 6 illustrates an example of an erase operation performed on one or more memory cells, such as a plurality of memory cells 208 in FIG. 2, e.g., a single NAND string 206 or a plurality of NAND strings 206 (e.g., NAND stings $206_1$ to $206_M$), concurrently. One or more erase cycles CY of the erase operation might be performed to erase the plurality of memory cells. For example, the erase cycles may be performed in succession until a respective erase verify passes or until a certain number of erase cycles are performed without an erase verify passing.

The discrete erase voltages (e.g., erase pulses) VE in FIG. 6 may increase with increasing cycle number. For example, for each successive increase in erase cycle number, the erase voltage might increase by the erase voltage step $\Delta V$ in a manner similar to that discussed above in conjunction with FIG. 4.

The erase verify voltages EV in FIG. 6 might be stored as a trim set in trim circuitry 125 that might be applied when the memory device is less worn, and fewer program/erase operations have been performed. The erase verify voltages EV in FIG. 4 might be stored as another trim set in trim circuitry 125 that might applied when the memory device is more worn, and more program/erase operations have been performed. For example, the trim set including erase verify voltages EV in FIG. 6 might be applied in response to the number of program/erase operations being less than or equal to a certain number, and the trim set including erase verify voltages EV in FIG. 4 might be applied in response to the number of program/erase operations being greater than the certain number.

Erase verify voltage EV7 applied during cycle CY7 might be less than the erase voltages EV1 to EV6 respectively applied during cycles CD to CY6. Erase voltages EV1 and EV6 might be equal to each other; erase voltages EV2 and EV3 respectively applied during cycles CY2 and CY3 might be equal to each other; and erase voltages EV4 and EV5 respectively applied during cycles CY4 and CY5 might be equal to each other. Erase voltages EV1 and EV6 might be less than erase voltages EV4 and EV5, and erase voltages EV4 and EV5 might be less than erase voltages EV2 and EV3.

Note each erase verify voltage may be based on (e.g., may be a function of) the number of the respective verify voltage in the erase operation, the number of the specific erase cycle being performed in the erase operation, or the number of the discrete erase voltages that have been applied during the erase operation before applying the erase verify voltage. For example, erase verify voltage EV7 may be based on the fact that it is applied during the seventh cycle of the erase operation, that seven discrete erase voltages have been applied during the erase operation before applying the erase verify voltage EV7, or that erase verify voltage EV7 is the seventh erase verify voltage applied during the erase operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of erasing a memory device, comprising:
performing a current erase cycle of an erase operation on a plurality of memory cells in response to the plurality of memory cells failing an erase verify of a preceding erase cycle of the erase operation;
wherein performing the current erase cycle of the erase operation comprises selecting an erase verify voltage to be applied during the current erase cycle from a plurality of erase verify voltages based on where in the erase operation the current erase cycle occurs; and
wherein the selected erase verify voltage to be applied during the current erase cycle is less than any erase verify voltage applied during the erase verify of the preceding erase cycle.

2. The method of claim 1, wherein the selected erase verify voltage is based on the number of the current erase cycle in the erase operation during which the selected erase verify voltage is applied.

3. The method of claim 1, wherein the selected erase verify voltage is based on the number of the selected erase verify voltage in the erase operation.

4. The method of claim 1, wherein the plurality of memory cells is a single string of series-coupled memory cells.

5. The method of claim 1, wherein the plurality of memory cells is a plurality of strings of series-coupled memory cells.

6. The method of claim 1, wherein the erase verify voltage applied during the current erase cycle is an only erase verify voltage applied during the current erase cycle and wherein only one erase verify voltage is applied during the preceding erase cycle.

7. A method of erasing a memory device, comprising:
performing a current erase cycle of an erase operation on a plurality of memory cells in response to the plurality of memory cells failing an erase verify of a preceding erase cycle of the erase operation;
wherein performing the current erase cycle of the erase operation comprises selecting an erase verify voltage to be applied during the current erase cycle from a plurality of erase verify voltages based on where in the erase operation the current erase cycle occurs;
wherein the selected erase verify voltage to be applied during the current erase cycle is less than any erase verify voltage applied during the erase verify of the preceding erase cycle and;
wherein selecting the erase verify voltage to be applied during the current erase cycle from the plurality of erase verify voltages based on where in the erase operation the current erase cycle occurs comprises selecting the erase verify voltage from a plurality of erase verify voltages that monotonically decrease as a number of erase cycles of the erase operation increases.

8. The method of claim 7, wherein selecting the erase verify voltage from the plurality of erase verify voltages that monotonically decrease as the number of erase cycles of the erase operation increases occurs when a number of program/erase operations performed on the plurality of memory cells is greater than a certain number.

9. A method of erasing a memory device, comprising:
performing an erase cycle of an erase operation on a plurality of memory cells;
wherein performing the erase cycle of the erase operation comprises selecting a first erase verify voltage to be applied during the erase cycle when the erase cycle is any one of a first plurality of erase cycles of the erase operation and selecting a second erase verify voltage to be applied during the erase cycle when the erase cycle is any one of a second plurality of erase cycles of the erase operation;
wherein one of the second plurality of erase cycles is performed in response to one of first plurality of erase cycles failing an erase verify and
wherein the second erase verify voltage applied during the one of the second plurality of erase cycles performed in response to the one of first plurality of erase cycles failing the erase verify is less than any first erase verify voltage applied during the one of the first plurality of erase cycles that failed the erase verify.

10. A method of erasing a memory device, comprising:
performing a first erase cycle of an erase operation on a plurality of memory cells; and
performing a second erase cycle of the erase operation on the plurality of memory cells in response to the plurality of memory cells failing an erase verify of the first erase cycle;
wherein the first erase cycle and the second erase cycle each comprise only one erase verify voltage; and
wherein the only one erase verify voltage of the second erase cycle is less than the only one erase verify voltage of the first erase cycle.

11. The method of claim 10, wherein the only one erase verify voltage of the second erase cycle is less than the only one erase verify voltage of the first erase cycle when a number of program/erase operations performed on the plurality of memory cells is greater than a certain number, and wherein the only one erase verify voltage of the second erase cycle is greater than the only one erase verify voltage of the first erase cycle when the number of program/erase operations performed on the plurality of memory cells is less than or equal to the certain number.

12. The method of claim 10, wherein performing the first erase cycle of the erase operation on the plurality of memory cells is in response to a prior erase cycle of the erase operation performed on the plurality of memory cells prior to the first erase cycle failing an erase verify of the prior erase cycle, wherein the prior erase cycle uses the same erase verify voltage as the first erase cycle, and further comprising performing a third erase cycle of the erase operation on the plurality of memory cells in response to the plurality of memory cells failing an erase verify of the second erase cycle, wherein the third erase cycle uses the same erase verify voltage as the second erase cycle.

13. The method of claim 10, wherein the first erase cycle and the second erase cycle respectively comprise first and second erase voltages, wherein the second erase voltage is greater that the first erase voltage.

14. A method of erasing a memory device, comprising:
applying an erase voltage during a current erase cycle of an erase operation to a channel of a plurality of memory cells to be erased, in response to the plurality of memory cells failing an erase verify of a preceding erase cycle of the erase operation; and
applying an erase verify voltage to access lines coupled to the plurality of memory cells during the current erase cycle after removing the erase voltage from the channel;
wherein the erase verify voltage applied during the current erase cycle is less than any erase verify voltage applied to the access lines coupled to the plurality of memory cells during the preceding erase cycle.

15. The method of claim 14, wherein the erase verify voltage applied during the current erase cycle is an only erase verify voltage applied during the current erase cycle and wherein only one erase verify voltage is applied during the preceding erase cycle.

16. The method of claim 14, wherein the erase verify voltage applied during the preceding erase cycle and the erase verify voltage applied during the current erase cycle that is less than any erase verify voltage applied during the preceding erase cycle are applied when a number of program/erase operations performed on the plurality of memory cells is greater than a certain number.

17. The method of claim 14, wherein the erase verify voltage applied during the current erase cycle is based on a number of the current erase cycle in the erase operation or a number of the erase voltages applied to the conductive region during the erase operation prior to applying the erase verify voltage applied during the current erase cycle.

18. The method of claim 14, wherein the preceding erase cycle is one of a plurality of preceding erase cycles of the erase operation, wherein the same erase verify voltage is applied to the access lines coupled to the plurality of memory cells during each of the plurality of preceding erase cycles of the erase operation.

19. The method of claim 14, wherein the erase voltage applied during the current erase cycle of the erase operation is greater than an erase voltage applied during the preceding erase cycle of the erase operation.

20. A memory device, comprising:
a memory array; and
control logic;
wherein the control logic is configured to perform a current erase cycle of an erase operation on a plurality of memory cells of the memory array in response to the plurality of memory cells failing an erase verify of a preceding erase cycle of the erase operation;
wherein the control logic is configured to select an erase verify voltage to be applied during the current erase cycle from a plurality of erase verify voltages based on where in the erase operation the current erase cycle occurs; and
wherein the selected erase verify voltage to be applied during the current erase cycle is less than any erase verify voltage applied during the erase verify of the preceding erase cycle.

21. The memory device of claim 20, wherein the control logic comprises trim circuitry configured to store the plurality of erase verify voltages.

22. A memory device, comprising:
a memory array; and
control logic;
wherein the control logic is configured to perform a current erase cycle of an erase operation on a plurality of memory cells of the memory array in response to the plurality of memory cells failing an erase verify of a preceding erase cycle of the erase operation;
wherein the control logic is configured to select an erase verify voltage to be applied during the current erase cycle from a plurality of erase verify voltages based on where in the erase operation the current erase cycle occurs;
wherein the selected erase verify voltage to be applied during the current erase cycle is less than any erase verify voltage applied during the erase verify of the preceding erase cycle; and
wherein the control logic is configured to select the erase verify voltage to be applied during the current erase cycle from a plurality of erase verify voltages that monotonically decrease as the number of erase cycles of the erase operation increases.

23. The memory device of claim 22, wherein the control logic is configured to select the erase verify voltage from the plurality of erase verify voltages that monotonically decrease as the number of erase cycles of the erase operation increases when a number of program/erase operations performed on the plurality of memory cells is greater than a certain number.

24. A memory device, comprising:
a memory array; and
control logic;
wherein the control logic is configured to perform an erase cycle of an erase operation on a plurality of memory cells;
wherein the control logic is configured to select a first erase verify voltage to be applied during the erase cycle when the erase cycle is any one of a first plurality of erase cycles of the erase operation and to select a second erase verify voltage to be applied during the erase cycle when the erase cycle is any one of a second plurality of erase cycles of the erase operation;
wherein the control logic is configured to perform one of the second plurality of erase cycles in response to one of first plurality of erase cycles failing an erase verify; and
wherein the second erase verify voltage applied during the one of the second plurality of erase cycles performed in response to the one of first plurality of erase cycles failing the erase verify is less than any first erase verify voltage applied during the one of the first plurality of erase cycles that failed the erase verify.

25. A memory device, comprising:
a memory array;
control logic;
wherein the control logic is configured to perform a first erase cycle of an erase operation on a plurality of memory cells;
wherein the control logic is configured to perform a second erase cycle of the erase operation on the plurality of memory cells in response to the plurality of memory cells failing an erase verify of the first erase cycle; and
wherein the first erase cycle and the second erase cycle each comprise only one erase verify voltage; and
wherein the only one erase verify voltage of the second erase cycle is less than the only one erase verify voltage of the first erase cycle.

26. The memory device of claim 25, wherein the only one erase verify voltage of the second erase cycle is less than the only one erase verify voltage of the first erase cycle when a number of program/erase operations performed on the plurality of memory cells is greater than a certain number, and wherein the only one erase verify voltage of the second erase cycle is greater than the only one erase verify voltage of the first erase cycle when the number of program/erase operations performed on the plurality of memory cells is less than or equal to the certain number.

27. A memory device, comprising:
a memory array; and
control logic comprising trim circuitry;
wherein the trim circuitry stores a first plurality of erase verify voltages and a second plurality of erase verify voltages;
wherein the control logic is configured to perform a current erase cycle of an erase operation performed on a plurality of memory cells of the memory array in response to the plurality of memory cells failing an erase verify of a preceding erase cycle of the erase operation;
wherein the control logic is configured to select an erase verify voltage to be applied during the current erase cycle from the first plurality of erase verify voltages when a number of program/erase operations performed on the plurality of memory cells of the memory array is less than a certain number and to select an erase verify voltage to be applied during the current erase cycle from the second plurality of erase verify voltages when the number of program/erase operations performed on the plurality of memory cells is greater than the certain number;
wherein the control logic is configured to select the erase verify voltage from either the first or the second plurality of erase verify voltages based on where in the erase operation the current erase cycle occurs; and
wherein the erase verify voltage selected from the second plurality of erase verify voltages to be applied during the current erase cycle is less than any erase verify voltage applied during the erase verify of the preceding erase cycle.

28. A memory device, comprising:
a memory array; and
control logic comprising trim circuitry;
wherein the trim circuitry stores a first plurality of erase verify voltages and a second plurality of erase verify voltages;
wherein the control logic is configured to perform a current erase cycle of an erase operation performed on a plurality of memory cells of the memory array in response to the plurality of memory cells failing an erase verify of a preceding erase cycle of the erase operation;
wherein the control logic is configured to select an erase verify voltage to be applied during the current erase cycle from the first plurality of erase verify voltages when a number of program/erase operations performed on the plurality of memory cells of the memory array is less than a certain number and to select an erase verify voltage to be applied during the current erase cycle from the second plurality of erase verify voltages when the number of program/erase operations performed on the plurality of memory cells is greater than the certain number;
wherein the control logic is configured to select the erase verify voltage from either the first or the second plurality of erase verify voltages based on where in the erase operation the current erase cycle occurs;
wherein the erase verify voltage selected from the second plurality of erase verify voltages to be applied during the current erase cycle is less than any erase verify voltage applied during the erase verify of the preceding erase cycle; and
wherein the second plurality of erase verify voltages monotonically decrease with an increasing number of erase cycles that are performed when the number of program/erase operations performed on the plurality of memory cells is greater than the certain number.

* * * * *